United States Patent [19]

Shinoda et al.

[11] 3,767,984

[45] Oct. 23, 1973

[54] SCHOTTKY BARRIER TYPE FIELD EFFECT TRANSISTOR

[75] Inventors: Daizaburo Shinoda; Nobuo Kawamura, both of Tokyo, Japan

[73] Assignee: Nippon Electric Company, Limited, Tokyo, Japan

[22] Filed: Sept. 13, 1972

[21] Appl. No.: 288,903

Related U.S. Application Data

[63] Continuation-in-part of Ser. No. 66,997, Aug. 26, 1970, abandoned.

[30] Foreign Application Priority Data

Sept. 3, 1969 Japan .................................. 44/70202
Nov. 29, 1969 Japan .................................. 44/96087

[52] U.S. Cl..........317/235 R, 317/235 B, 317/235 U
[51] Int. Cl. ........................................... H01l 11/14
[58] Field of Search .................... 317/235 B, 235 U, 317/235 R, 234 R

[56] References Cited

UNITED STATES PATENTS 3,657,615 4/1972 Driver ........................... 317/235 R
3,516,021 6/1970 Kohn ............................... 331/117

OTHER PUBLICATIONS

Dewit, I.B.M. Tech. Discl. Bull., Vol. 9, No. 1, June 1966

*Primary Examiner*—Martin H. Edlow
*Attorney*—Nichol M. Sandoe et al.

[57] ABSTRACT

A Schottky barrier gate field effect transistor is capable of operating in the enhancement mode. The transistor includes a gallium arsenide layer formed on a substrate. The relationship between the thickness W and impurity concentration N of the gallium arsenide layer is given by the expression:

$$2 \times 10^3 cm^{-1/2} < W \cdot \sqrt{N} < 3 \times 10^3 cm^{-1/2}.$$

3 Claims, 5 Drawing Figures

INVENTORS
DAIZABURO SHINODA
NOBUO KAWAMURA by
Sandoe, Hopgood & Calimafde
ATTORNEYS

SCHOTTKY BARRIER TYPE FIELD EFFECT TRANSISTOR

This application is a continuation-in-part of our application Ser. No. 66,997, filed Aug. 26, 1970, now abandoned.

This invention relates generally to Schottky barrier gate field effect transistors and, more specifically, to a Schottky barrier gate field effect transistor operating in the so-called enhancement (normal-off) mode in which the drain current ($I_D$) flowing between the source and drain is cut off when the gate bias voltage is zero, and wherein the application of a forward bias to the gate causes a channel to be formed between the source and drain to thereby cause drain current flow.

The conventional Schottky barrier gate field effect transistor is fabricated by forming a thin vapor-grown layer of silicon on a silicon substrate having high resistivity or on an insulating substrate. Two metallic electrodes making ohmic contact with silicon are then provided on the silicon vapor-grown layer by an evaporation technique, or the like, thereby forming the source and drain electrodes respectively, and a metal such as molybdenum (Mo), gold (Au), or the like is evaporated onto the silicon vapor-grown layer, thereby forming a gate electrode forming a Schottky barrier near the boundary with the silicon layer.

In the conventional Schottky barrier gate field effect transistor, the depletion layer generated due to the Schottky barrier is thin as compared to the silicon vapor-grown layer when the gate bias voltage is zero, and it is difficult to control this initial thickness of the depletion layer. Therefore filed effect transistors of this type have been used only for depletion (normal-on) operation.

To increase the freedom of circuit design, it is a requirement that a Schottky barrier gate field effect transistor should also be able to operate in the enhancement mode. For example, a transistor of this type operative in the enhancement mode is needed in addition to the conventional depletion mode transistor when it is desired to form a complementary circuit by using Schottky barrier gate field effect transistors.

It is, therefore, an object of this invention to provide a Schottky barrier gate field effect transistor of the enhancement mode type.

It is another object of the invention to provide a Schottky barrier gate field effect transistor in which the depth of the depletion layer at zero gate potential can be controlled.

According to this invention, the thickness of the semiconductor vapor-grown layer is made thinner than that of the depletion layer of the Schottky barrier.

When gallium arsenide (GaAs) is used for the material of the semiconductor vapor-grown layer, aluminum, gold, nickel, chromium or the like can be employed as the metal of the gate electrode. When silicon is used for the vapor-grown layer, it is desirable to use molybdenum, platinum, platinum silicide, gold, palladium, palladium silicide, or the like for the metal of the gate electrode. When the gate electrode is made of platinum silicide, which may be formed by the interaction of silicon of the vapor-grown layer and platinum, it then becomes possible to form the depletion layer deeply in the gate electrode and to freely control the position of the depletion layer. This eliminates the need for strictly controlling the depth of the vapor-grown layer. This feature is particularly effective when Schottky barrier gate field effect transistors of both the depletion mode type and the enhancement mode type are formed on a common substrate.

The invention will be better understood from the following description taken in connection with the accompanying drawings in which.

Figure 1:
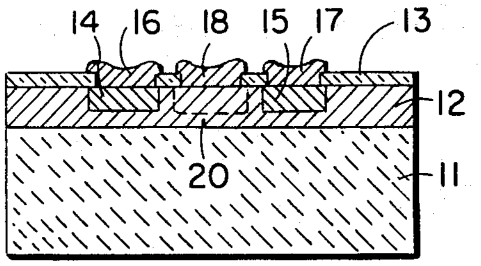
FIG. 1 is a cross-sectional view of a conventional Schottky barrier gate field effect transistor of the depletion mode type.

Referring to FIG. 1, the conventional Schottky barrier gate field effect transistor of the depletion mode type is fabricated by forming a vapor-grown layer 12 of low-resistivity *n*-type silicon having an impurity density of $10^{16}$ – $10^{17}$ $cm^{-3}$ on a high-resistivity p-type silicon substrate 11 of about $10^4$ ohm-cm in specific resistance. The surface of layer 12 is oxidized by a thermal oxidation process to form a silicon oxide ($SiO_2$) film 13, and sections of silicon oxide film 13 corresponding to the portions 16 and 17, which are to become the source and drain respectively, are removed by a photo-etching technique. An n-type impurity is diffused thereinto whereby n+ layers 14 and 15 are formed, the section of silicon oxide film 13 corresponding to the portion 18 which is to become the gate electrode is removed, and molybdenum is evaporated onto the portions 16, 17 and 18 thereby forming the source, drain and gate electrodes.

The molybdenum evaporated to the gate electrode portion 18 serves to form a Schottky barrier between the gate electrode and silicon film 12, and, as a result, a depletion layer 19 is formed beneath the gate electrode. In addition, the molybdenum evaporated to the source and drain electrode portions 16 and 17 form an ohmic contact with the high density n+ type silicon vapor-grown layer.

In the prior art transistor structure of FIG. 1, the n-type silicon vapor-grown layer 12 is thicker than the depletion layer 19 of the Schottky barrier which is formed in the vapor-grown layer 12 when the gate bias voltage is zero. This type of conventional field effect transistor is thus operated in the depletion mode in which a negative bias is applied to the gate electrode 18 to expand the depletion layer 19 of the Schottky barrier, thereby narrowing the width of the channel region 20 beneath the depletion layer 19 and thus increasing the resistance between the source and drain and decreasing the drain current.

Figure 2:
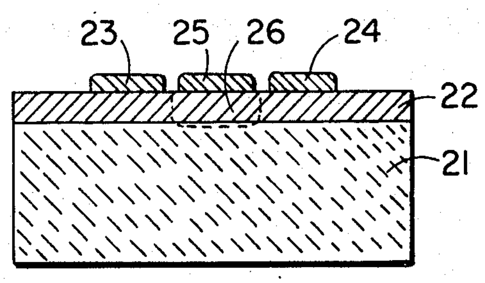
FIG. 2 is a cross-sectional view of a first preferred embodiment of a Schottky barrier gate field effect transistor of the enhancement mode type according to the invention.

Referring to FIG. 2, the first embodiment of the enhancement type Schottky barrier gate field effect transistor according to this invention is fabricated by vapor growing a very thin layer 22 having a thickness less than $0.3 - 1.0\mu$ of n-type gallium arsenide having an impurity concentration of $10^{15} - 10^{-3}$ on one surface of a high resistivity gallium aresenide substrate 21 of $10^7 - 10^8$ Ω-cm in specific resistance. Source and drain electrodes 23 and 24 consisting of a metal which makes an ohmic contact with the gallium aresenide layer 22 are formed on layer 22, and a gate electrode 25 consisting of a metal such as aluminum, molybdenum, or gold which forms a Schottky barrier at the interface with the gallium-arsenide layer is attached to layer 22. As a result, the depletion layer 26 of the Schottky barrier reaches the substrate 21 and hence the source electrode 23 is electrically isolated from the drain electrode 24. The thickness of vapor-grown layer 22 is selected below $0.3 - 1.0\mu$ according to the impurity concentration, with the result that the thickness of the depletion layer 26 of the Schottky barrier is greater than that of the vapor-grown layer, and that the enhancement mode operation can be achieved by supplying the gate electrode with a forward bias voltage. More specifically, the thickness W of the gallium aresenide layer 22 and the impurity concentration N of the layer should roughly meet the condition:

$$2 \times 10^{-3}\text{cm}^{-1/2} < W \cdot \sqrt{N} < 3 \times 10^{3}\ \text{cm}^{-1/2}$$

while N should preferably be within the range from $1 \times 10^{15}$ cm$^{-3}$ to $1 \times 10^{16}$ cm$^{-3}$. For a value of $W \cdot \sqrt{N}$ greater than $3 \times 10^3\text{cm}^{-1/2}$, an input of 0 volt at the gate electrode is not sufficient to cause the depletion layer to extend to the substrate 21 across the semiconductor layer 22. On the other hand, for a value of $W \cdot \sqrt{N}$ less than $2 \times 10^3\text{cm}^{-1/2}$, the gate voltage required to create the source-drain channel is greater than 0.4 volts, which tends to cause a current to flow from the gate electrode to the source electrode, thereby impairing the transistor action.

This embodiment has the following advantages. When an inverter circuit is formed by using the conventional field effect transistor of the depletion mode type, +1 and 0 signals are produced in response to 0 and −1 signals. Therefore, a level shift circuit must be employed to change given signals into 0 and −1 input signals for the next circuit when the output signal of the former stage is connected to the gate of the conventional field effect transistor in the next stage. In contrast, when an inverter is formed by using the field effect transistor of this invention, no level shift circuit is needed and the output of the preceding stage can be connected directly to the gate of the next stage, because +1 and 0 output signals are produced in response to 0 and +1 input signals.

Moreover, when the enhancement type field effect transistor is used as a resistance element, a high resistance can be obtained without any gate bias voltage, in contrast to the depletion type field effect transistor which, when used as a resistor, requires a suitable gate bias voltage in order to obtain a high resistance.

The thickness of the depletion layer, however, is constant irrespective of the process of forming the gate electrode. Therefore, this first embodiment has a shortcoming in that it is very difficult to fabricate both enhancement and depletion type Schottky barrier field effect transistors in one vapor-grown layer.

Figure 3:
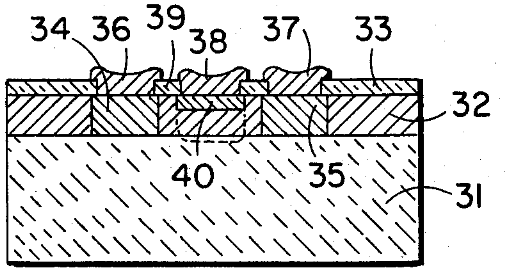
FIG. 3 is a cross-sectional view of a second preferred embodiment of this invention using platinum silicide as a gate electrode.

FIG. 3 illustrates another structure of an enhancement mode type Schottky barrier gate field effect transistor embodying this invention. This transistor is formed in the following manner. A low-resistivity layer 32 of *n*-type silicon having an impurity concentration of about $1 \times 10^{16}\text{cm}^{-3}$ and a thickness of $0.6\mu$ is vapor-grown on a high-resistive p-type silicon substrate 31 having a specific resistance of about $10^4$ ohm-cm. The surface of the grown layer 32 is oxidized by a thermal oxidation process, thereby forming a silicon oxide film 33 of $0.2\mu - 0.3\mu$ in thickness. In this process, the layer 32 is reduced in thickness to $0.49\mu - 0.45\mu$. Thereafter, those sections of the silicon oxide film 33 corresponding to the portions 36 and 37, which are to become the source and drain electrodes, respectively, are removed by a photoetching technique, and an *n*-type impurity is diffused thereinto whereby $n+$ layers 34 and 35 are formed.

A silicon oxide layer is formed again to cover the source and drain electrode regions. An additional section of silicon oxide film 33 is then removed at the location of the gate portion 38. Platinum is attached to the whole surface of the substrate covered with the silicon oxide film except at the gate portion 38 by vacuum evaporation or a sputtering technique, and a platinum silicide region 40 is then formed by thermal treatment. In this process, the depth of the platinum silicide region 40 is adjusted so that a depletion layer 39 of the Schottky barrier formed between the platinum silicide region 40 and silicon layer 32 reaches the silicon substrate 31. For example, the thickness of the platinum attached to the substrate is $0.1\mu$ and thermal treatment is carried out at 500°C for about 10 minutes, which results in a platinum silicide region $0.2 - 0.3\mu$ deep, and a depletion layer about $0.28\mu$ deep. As a result, the depletion layer reaches the substrate 31 across the layer 32. Then the platinum coating is removed and the silicon oxide film is removed again from the source and drain electrode portions 36 and 37. After this process is completed, molybdenum and platinum are evaporated sequentially to the source, drain and gate portions 36, 37 and 38, whereby the source, drain and gate electrodes are formed.

Figure 4:
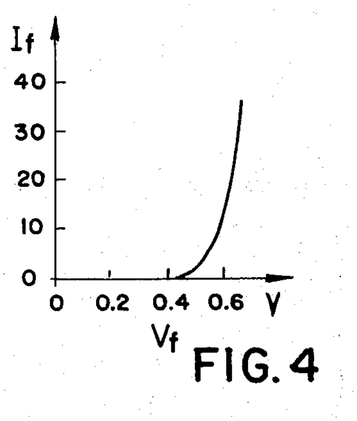
FIG. 4 is a graph of the forward gate current vs. gate voltage characteristic of the second embodiment of the invention.

FIG. 4 is a graph showing the forward current-voltage characteristic of the Schottky barrier formed by bringing the platinum silicide region into contact with the n-type silicon layer.

In the Schottky barrier gate field effect transistor of the second embodiment of this invention, the depletion layer 39 of the Schottky barrier extends through the silicon vapor-grown layer 32 to reach the high-resistivity silicon substrate 31 when the gate bias voltage is zero. Thus, a positive bias voltage greater than 0.4 volt causes forward current to flow. Particularly, when the positive bias voltage reaches a value greater than 0.5 volt, the transistor action is totally destroyed by the large forward current, as shown in FIG. 4. Therefore, with a positive bias voltage lower than 0.4 volt, it is possible to have the Schottky barrier gate field effect transistor operate in the enhancement mode.

The relation of the impurity concentration N and thickness W of the silicon layer satisfying the above condition should meet the following relation which is the same as in the case of the gallium arsenide layer:

$2 \times 10^3 cm^{-1/2} < W \cdot \sqrt{N} < 3 \times 10^3 cm^{-1/2}$ In general, it is preferred that the impurity concentration N be about $1 \times 10^{16} cm^{-3} - 5 \times 10^{16} cm^{-3}$, and the thickness of the layer beneath the platinum silicide be about $0.15\mu - 0.3\mu$.

In the second embodiment of the field effect transistor shown in FIG. 3, the thickness of the vapor-grown layer at the gate region beneath the platinum silicide region can be easily controlled by changing the condition of the thermal treatment of the deposited platinum. Therefore, it is very easy to form both enhancement and depletion mode type field effect transistors in one vapor-grown layer.

The embodiments of FIGS. 2 and 3 are examples wherein a Schottky barrier is formed in the gallium arsenide and silicon vapor-grown layers, respectively. However, when the thickness of the depletion layer is greater than that of the semiconductor layer, the Schottky barrier gate field effect transistor can be generally operated in the enhancement mode.

Instead of the silicon vapor-grown layer 32, other semiconductor layers can be employed. In this case, the metal adapted to form the Schottky barrier must be selected according to the semiconductor layer employed.

Figure 5:
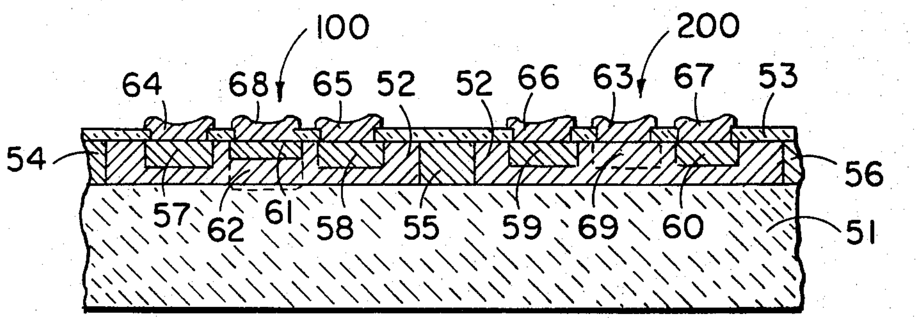
FIG. 5 is a cross-sectional view of a structure in which a Schottky barrier gate field effect transistor embodying this invention as in FIG. 3 and a conventional Schottky barrier gate field effect gate transistor of the depletion mode type are formed on a common substrate.

FIG. 5 shows a structure in which an enhancement mode type Schottky barrier gate field effect transistor 100 of this invention is formed together with a conventional Schottky barrier gate field effect transistor 200 of the depletion type in a common silicon vapor-grown layer 52. More specifically, a $0.6\mu$ thick layer 52 of n-type silicon having impurity concentration of $1 \times 10^{16} cm^{-3}$ is vapor-grown on a high-resistive p-type silicon substrate 51 having a specific resistance of $10^4$ ohm-cm. The surface of the layer 52 is coated with a silicon oxide film 53. In order to isolate individual transistors from one another, the boundary regions 54, 55 and 56 are converted into p-type regions by impurity diffusion. Parts of the vapor-grown layer 52 corresponding to the source and drain regions 57, 58, 59 and 60 are highly doped with an n-type impurity to have n+ conductivity. A platinum silicide region 61 is formed in the silicon vapor-grown layer 52 of a gate region so that a depletion layer 62 is produced in layer 52 and reaches the substrate 51. Molybdenum and platinum are attached sequentially to the source and drain electrodes 64, 65, 66 and 67 and gate electrodes 63 and 68 of the respective field effect transistors. A depletion layer 69 of the Schottky barrier which does not reach the substrate 51 is established between the molybdenum of the gate electrode 63 and n-type silicon layer 52 in the gate region of the conventional depletion type field effect transistor 200.

In the foregoing embodiments, the semiconductor layer is vapor-grown on the substrate. Alternatively, it may be formed in the semiconductor substrate by a known impurity-diffusion technique. Thus while the invention has been herein described with respect to several embodiments, it will be apparent that modifications may be made thereto, all without departing from the spirit and scope of the invention.

We claim:

1. A Schottky barrier gate field effect transistor comprising a substrate of high resistivity, an n-type gallium arsenide layer formed on said substrate; source and drain electrodes attached to said gallium arsenide layer, and a gate electrode formed on a portion of the surface of said gallium arsenide layer between said source and drain electrodes, said gate electrode being made of a metal selected from the group consisting of aluminum, gold, nickel and chromium, said gallium arsenide layer having an impurity concentration ranging from $1 \times 10^{15} cm^{-3}$ to $1 \times 10^{16} cm^{-3}$ and a thickness meeting the condition given by $$2 \times 10^3 cm^{-1/2} < W \cdot \sqrt{N} < 3 \times 10^3 cm^{-1/2}$$

where N and W represent, respectively, said impurity concentration and the thickness of said gallium arsenide layer measured at the portion of said layer lying beneath said gate electrode, whereby said field effect transistor is enabled to function in the enhancement mode.

2. A Schottky barrier gate field effect transistor comprising a substrate of high resistivity, an n-type silicon layer formed on said substrate, source and drain electrodes attached to said silicon layer, and a gate electrode formed on a portion of the surface of said n-type silicon layer between said source and drain electrodes, said gate electrode being made of a material selected from the group consisting of molybdenum, platinum, gold, palladium, platinum silicide and palladium silicide, wherein said silicon layer has an impurity concentration ranging from $1 \times 10^{16} cm^{-3}$ to $5 \times 10^{16} cm^{-3}$ and a thickness meeting the condition given by $$2 \times 10^3 cm^{-1/2} < W \cdot \sqrt{N} < 3 \times 10^3 cm^{-1/2}$$

where N and W represent, respectively, said impurity concentration and the thickness of said silicon layer measured at the portion of said layer lying beneath said gate electrode, whereby said field effect transistor is enabled to function in the enhancement mode.

3. The transistor as claimed in claim 2, wherein said gate electrode is made of platinum silicide and wherein the thickness of the portion of said semiconductor layer lying beneath said gate electrode is in the range from $0.15\mu$ to $0.3\mu$.

* * * * *